United States Patent [19]

Chidambarrao et al.

[11] Patent Number: 5,470,781
[45] Date of Patent: Nov. 28, 1995

[54] METHOD TO REDUCE STRESS FROM TRENCH STRUCTURE ON SOI WAFER

[75] Inventors: Dureseti Chidambarrao, Derby, Conn.; Louis L. Hsu, Fishkill, N.Y.; J. Daniel Mis; James P. Peng, both of Poughkeepsie, N.Y.

[73] Assignee: International Business Machines Corporation, Armonk, N.Y.

[21] Appl. No.: 166,415

[22] Filed: Dec. 14, 1993

Related U.S. Application Data

[62] Division of Ser. No. 991,010, Dec. 16, 1992, abandoned.

[51] Int. Cl.⁶ .................................................. H01L 21/302
[52] U.S. Cl. ................................................ 437/68; 437/62
[58] Field of Search .................... 437/67, 68, 62, 437/228; 148/DIG. 50; 156/644.1, 657.1

[56] References Cited

U.S. PATENT DOCUMENTS

| | | | |
|---|---|---|---|
| 4,916,086 | 4/1990 | Takahashi et al. | 437/62 |
| 5,084,408 | 1/1992 | Baba et al. | 437/62 |
| 5,196,373 | 3/1993 | Beasom | 437/62 |
| 5,236,861 | 8/1993 | Otsu | 437/67 |
| 5,416,041 | 5/1995 | Schwalke | 437/62 |

Primary Examiner—Olik Chaudhuri
Assistant Examiner—S. Mulpuri
Attorney, Agent, or Firm—Whitham, Curtis, Whitham & McGinn; Harold Huberfeld

[57] ABSTRACT

In an isolation trench in a silicon-on-insulator wafer, the sidewalls of the trench curve outwardly at the bottom of the trench where the top silicon layer meets the underlying oxide insulating layer. This sidewall geometry eliminates the sharp corner at the bottom of the trench. Preferably, the top edge of the trench wall is also curved.

5 Claims, 3 Drawing Sheets

METHOD TO REDUCE STRESS FROM TRENCH STRUCTURE ON SOI WAFER

"This application is a divisional of application Ser. No. 07/991,010, filed on Dec. 16, 1992", now abandoned.

BACKGROUND OF THE INVENTION

1. Field of the Invention

The present invention generally relates to an improved isolation trench geometry for trenches formed in silicon-on-oxide wafers, and more particularly to a geometry that reduces structural stress in the trench wall, and includes a process for forming such isolation trenches.

2. Description of the Prior Art

Building semiconductor devices on silicon-on-insulator (SOI) wafers is recent technology that has been introduced to improve circuit speed and device reliability. Depending on the circuit application, the thickness of the top silicon layer of a silicon-on-insulator wafer will vary from 0.05 µm to 15 µm. Normally, SOI device applications can be divided into three categories: (a) high density, low power digital CMOS applications where a thin silicon layer (about 0.05 to 0.2 µm) is desirable to form fully depleted MOS devices; (b) medium density, high speed and low voltage digital BiCMOS applications where a silicon thickness of 1.5 to 3.0 µm is needed in order to achieve optimum bipolar performance, i.e., high cut-off frequency; and (c) low density, high speed and high voltage analog BiCMOS devices where a large silicon thickness ranging from 8 to 15 µm is necessary in order to withstand high voltage operation.

Since each of these three SOI devices requires a different range of silicon layer thickness and different integrated device density, quite different isolation schemes are needed. For case (a) with the thin SOI, the isolation is usually formed by using a conventional recess oxidation (ROX) process. For Case (b) with the medium thickness SOI, trench isolation with an oxide sidewall and polysilicon fill is used. Lastly in case (c) with the thick SOI where there is a power limitation which allows only low density integration, simple junction isolation is adequate.

In cases (a) and (b), the prior art isolation recess or trench can develop regions of large stress. Ion implantation in these stress regions can result in a nucleate glide dislocation that can cause shorts or leakage in transistors.

SUMMARY OF THE INVENTION

An object of this invention is the provision of a silicon-on-insulator isolation trench free of geometries that result: in high stress in the silicon trench wall.

Another object of this invention is the provision of a method of forming a silicon-on-insulator isolation trench so that the trench sidewall is free of high stress producing sidewall geometries.

Briefly, this invention contemplates the provision of an isolation trench in a silicon-on-insulator wafer in which the sidewalls of the trench curve outwardly at the bottom of the trench where the top silicon layer meets the underlying oxide insulating layer. This sidewall geometry eliminates the sharp corner at the bottom of the trench. Preferably, the top edge of the trench wall is also curved.

To form the trench with an outwardly curving wall surface at the bottom of the trench, a trench etch is used that has a highly selective etch rate of silicon as compared to oxide. For example, an $SF_6/Cl_2$ plasma etches silicon at a rate that is 12 times faster than it etches silicon oxide. When the oxide layer of the silicon-on-insulator wafer is reached and exposed to such an etch, the vertical etch rate is significantly reduced. Over etching the trench into the oxide layer results primarily in a lateral undercutting at the bottom of the silicon trench walls. Any one of several methods can be used to determine when the top surface of the sub-oxide layer is reached; optical emission, a laser interferometer, or the etch can be timed. The degree of outward curvature can be controlled by controlling the duration of the over etch after the sub-oxide layer is reached. In a preferred embodiment, the top edge of the trench is rounded by ion sputtering during a final stage of the trench formation.

BRIEF DESCRIPTION OF THE DRAWINGS

The foregoing and other objects, aspects and advantages will be better understood from the following detailed description of a preferred embodiment of the invention with reference to the drawings, in which:

FIG. 1E shows the completed trench structure with the sidewall of the trench curved outwardly at the bottom of the trench.

DETAILED DESCRIPTION OF A PREFERRED EMBODIMENT OF THE INVENTION

Figure 1A:
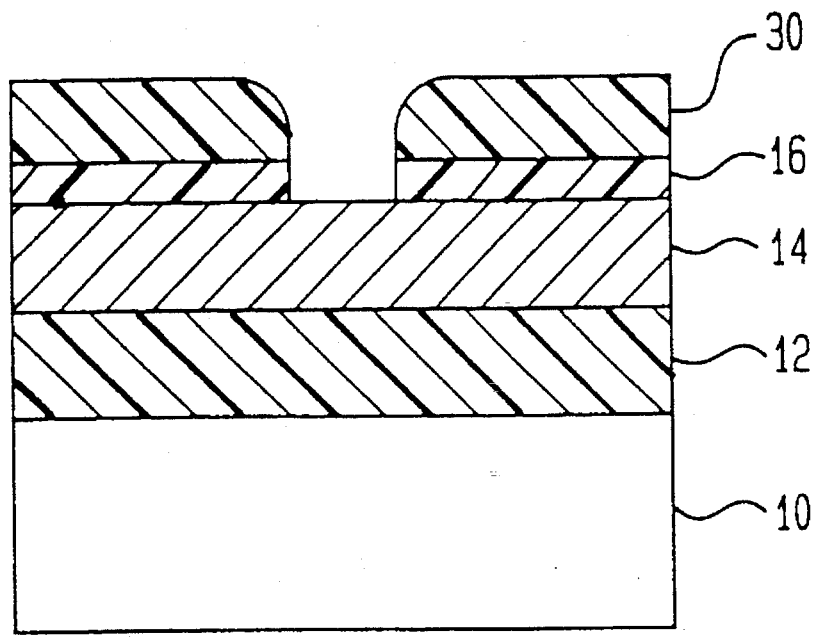
FIGS. 1A through 1G illustrate a trench structure in accordance with the teachings of this invention at successive stages in its fabrication.

Referring now to FIG. 1A, it shows a fragmentary, sectional view of a conventional silicon-on-insulator wafer for a medium density, high speed, low voltage digital BiCMOS applications. The wafer is comprised of a semiconductor substrate 10, a silicon-oxide ($SiO_2$) layer 12, and a single crystal silicon layer 14 whose thickness is on the order of between 1.5 µm and 3.0 µm. A suitable masking oxide layer 16 is deposited on the top surface of the silicon layer 14 and a photoresist layer 30 is formed in the oxide mask layer 16. The photoresist 30 is developed in the desired trench pattern and an opening 18 for the trench is formed in the oxide mask 16 by means of well-known semiconductor process steps.

Figure 1B:
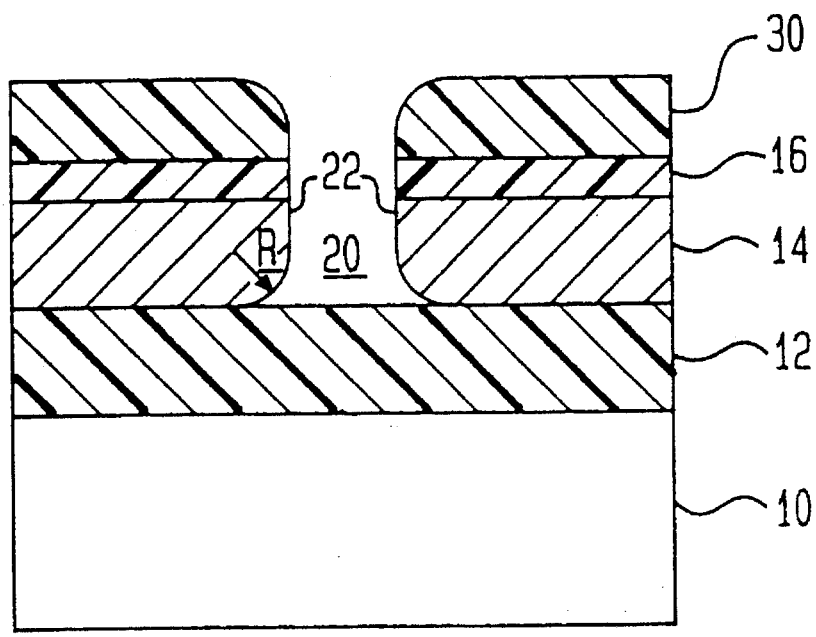

Referring now to FIG. 1B, an isolation trench 20 is formed in the top single crystal silicon layer 14 so that its sidewall 22, at the bottom of the trench curve outwardly from the center of the trench. The radius of outward curvature R should be in a range between that of the sidewall oxide thickness (between 500Å and 1000Å) and 25% of the thickness of the silicon layer 14.

To form the trench 20 with sidewalls 22 that curve outwardly from the bottom, an etching process is used that etches the silicon layer 14 selectively at a much higher rate than it etches the silicon-oxide layer 12. For example, a conventional $SF_6/Cl_2$ plasma etching process is suitable as it has a selectivity ratio of 12 to 1; that is, a $SF_6/Cl_2$ plasma etches the silicon layer 14 at twelve times the rate it etches the silicon-oxide layer 12. Other suitable known etching processes are $Cl_2/O_2$ plasma which has a similar selectivity. When the etching process has proceeded to the point where the surface of the oxide layer 12 is exposed, the rate of vertical etching is greatly reduced. Continued etching beyond this point results in a lateral undercutting of the silicon layer 14 at the bottom of the trench as shown in FIG. 1B. The duration during which the etch process continues after the oxide layer is exposed[, determines the radius of curvature R of the outwardly sloping sidewalls; the radius increases as the duration increases.

The top surface of the sublayer oxide 12 can be detected by a suitable method such as optical emission, laser interferometer or timing the etch. Typically, by monitoring Cl emission line (wavelength 308 nm) a reproducible end point characteristic can be obtained. Normally several large end point test sites are located on the wafer. The degree of convexness of the silicon bottom can be controlled by controlling the percentage of overetch.

Figure 1C:
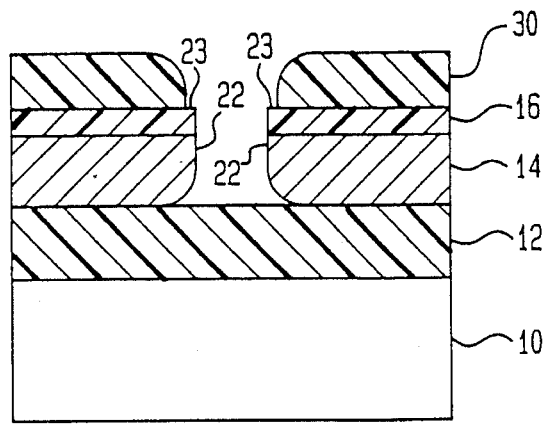
Figure 1D:
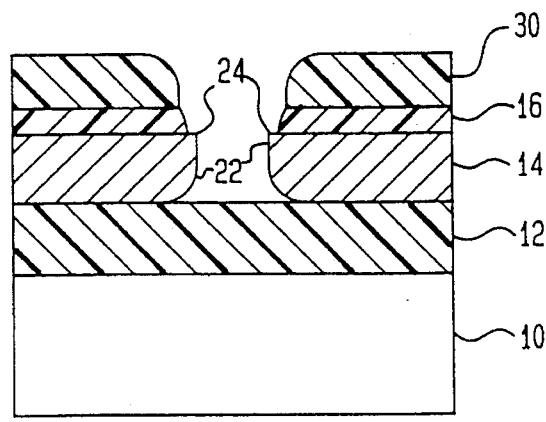
Figure 1E:
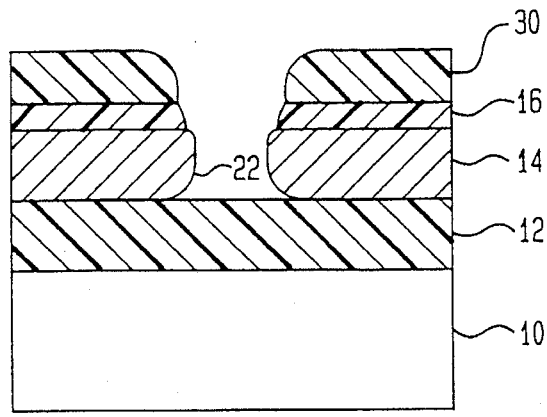

Preferably, the top corners 24 of the trench sidewalls are also slightly rounded to further reduce points of stress. To this end, the photoresist layer 30 is pulled back slightly from the trench opening by means, for example, of an $O_2$ plasma etch that exposes a small region 23 of the surface of the oxide layer 16, as shown in FIG. 1C. Next, the exposed surface of the oxide layer 16 is trimmed away by means of a $CF_4$ plasma etch step to expose the top corners of the trench in silicon layer 14. The structure at this stage is shown in FIG. 1D. A $Cl_2$ $O_2$ plasma etch for a brief interval is used to cut away and thereby round the top corners 24 of the trench sidewall as shown in FIG. 1E.

Figure 1F:
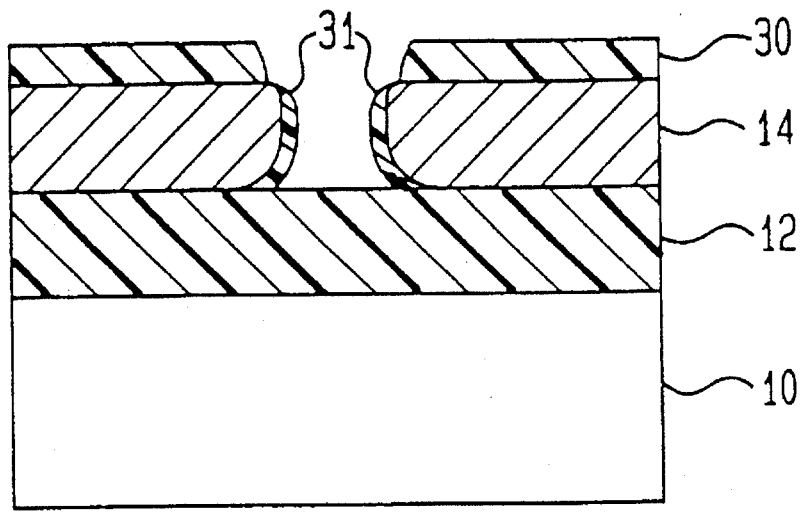
Figure 1G:
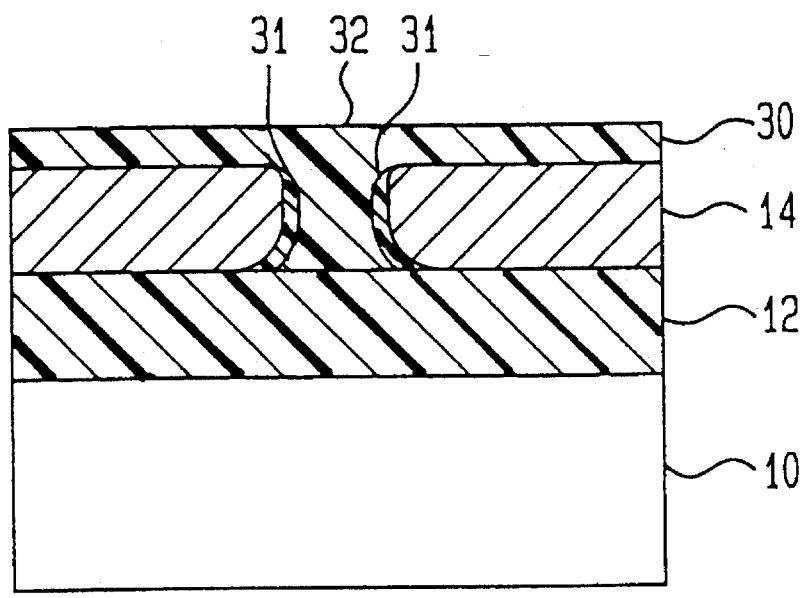

After the trench is formed, the photoresist is removed, an oxide layer 31 is grown on the trench sidewalls using a suitable prior art process such as conventional thermal oxidation at 950° C. or high pressure oxidation at 700° C. to grow oxide about 600Å thick as shown in FIG. 1F. The trench is then filled with polysilicon 32 using a conventional chemical vapor deposition process. After planarization, the structure at this stage is shown in FIG. 1G. After the structure is completed to this stage, a stress relief annealing step is preferably carried out at about 1050° C. to 1100° C. for about 20 minutes in a forming gas (e.g. 10% $H_2$, 90% $N_2$).

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A method of forming an isolation trench in a silicon-on-insulator wafer including a silicon layer overlying an insulator layer, comprising the steps of:

etching through an opening in a masking layer that overlies said silicon layer to a surface of said insulator layer with an etchant that selectively etches said silicon layer at a higher rate compared with the rate at which it etches said insulator layer; and undercutting said silicon layer at said surface of said insulator layer continuing the etching process of said etching step for an interval so that walls formed in said silicon layer are outwardly curved where they meet said insulator layer.

2. A method of forming an isolation trench in a silicon-on-insulator wafer including a silicon layer overlying and insulator layer, comprising the steps of:

etching a trench opening into said silicon layer through a masking layer that overlies said silicon layer, said trench opening forming top corners at the upper surface of said silicon layer and an outwardly curved rounded edge of said silicon layer at said insulator layer;

removing a portion of said masking layer to expose a region of said silicon layer extending away from the top corners of said trench opening formed in said etching step; and etching said region of said silicon layer to form a curve at said top corners of said trench opening.

3. A method of forming an isolation trench in a silicon-on-insulator wafer including a silicon layer overlying an insulator layer, comprising the steps of:

etching through a trench opening in a masking layer that overlies said silicon layer to said insulator layer with an etchant that selectively etches said silicon layer at a higher rate compared with the rate at which it etches said insulator layer and forming top corners at an upper surface of said silicon layer;

undercutting said silicon layer at said surface of said insulator layer b continuing the etching of said previous step for an interval so that walls formed in said silicon layer are outwardly curved where said walls meet said insulator layer with said trench opening;

removing a portion of said masking layer to expose a region of said silicon layer extending away from said top corners formed in said etching step;

etching said region of said silicon layer to form a curve at said top corners of said trench opening.

4. A method of forming an isolation trench in a silicon-on-insulator wafer including a silicon layer overlying an insulator layer as in claim 2, including the further step of annealing said silicon-on-insulator wafer in a forming atmosphere.

5. A method of forming an isolation trench in a silicon-on-insulator wafer including a silicon layer overlying an insulator layer as in claim 3, including the further step of annealing said silicon-on-insulator wafer in a forming atmosphere.

\* \* \* \* \*